United States Patent [19]

Sugishima et al.

[11] Patent Number: 5,497,289
[45] Date of Patent: Mar. 5, 1996

[54] INVERTER APPARATUS AND METHOD THEREFOR

[75] Inventors: Eiichi Sugishima; Naohiro Hirose; Wataru Ikeshita; Shinzo Tomonaga, all of Aichi, Japan

[73] Assignee: Mitsubishi Denki Kabushiki Kaisha, Tokyo, Japan

[21] Appl. No.: 123,217

[22] Filed: Sep. 20, 1993

[30] Foreign Application Priority Data

Sep. 30, 1992 [JP] Japan .................................. 4-261504
Jan. 29, 1993 [JP] Japan .................................. 5-013700

[51] Int. Cl.⁶ ................................................ H05K 7/20
[52] U.S. Cl. ..................... 361/709; 361/810; 361/600; 363/37; 363/141; 318/558
[58] Field of Search .................................. 361/688, 704, 361/707, 709, 711, 717, 718, 719, 720, 721, 722, 600, 679, 690, 807, 808, 809, 810, 811; 318/558; 307/149, 150, 151; 363/37, 141

[56] References Cited

U.S. PATENT DOCUMENTS

| | | |
|---|---|---|
| 3,340,413 | 9/1967 | Drabik . |
| 4,772,999 | 9/1988 | Fiorina et al. . |
| 4,872,102 | 10/1989 | Getter . |
| 5,012,173 | 4/1991 | Fujioka et al. . |
| 5,237,494 | 8/1993 | Baader et al. . |

FOREIGN PATENT DOCUMENTS

| | | |
|---|---|---|
| 1202220 | 8/1970 | United Kingdom . |
| 1335609 | 10/1973 | United Kingdom . |
| 2199203 | 6/1988 | United Kingdom . |
| 2214731 | 1/1989 | United Kingdom . |
| 2238167 | 5/1991 | United Kingdom . |
| 2249439 | 5/1992 | United Kingdom . |

*Primary Examiner*—Bentsu Ro
*Attorney, Agent, or Firm*—Sughrue, Mion, Zinn, Macpeak & Seas; Richard C. Turner; Raymond H. J. Powell, Jr.

[57] ABSTRACT

An inverter apparatus having a compact design and a changeable heat sink. The apparatus includes a power module formed in a case having pairs of parallel sides and containing the respective main circuit semiconductor devices for converting an alternating current input into a direct current and then further into an alternating current of variable frequency. The heat sink also has pairs of parallel sides and interfaces with the case in a plane whereon the projections of the sink and the case are coextensive. The apparatus also has a body with pairs of parallel sides that fasten to the case and constitute part of the enclosure of the inverter apparatus. The body, case, heat sink and associated circuit elements have alignment structures that permit easy and reliable disassembly and assembly of the apparatus.

14 Claims, 5 Drawing Sheets

INVERTER APPARATUS AND METHOD THEREFOR

BACKGROUND OF THE INVENTION

1. Field of the Invention

The present invention relates to an inverter apparatus and a method for using the inverter apparatus, particularly one where a heat sink is easily installed, removed, and changed.

2. Description of the Background Art

FIG. 7 shows the arrangement of a conventional inverter apparatus, wherein the numeral 70 indicates a heat sink, 71 denotes a power module secured to the heat sink 70 by screws 72 with a cooling surface 73 thereof on the bottom side, and 74 represents a printed circuit board which is disposed above the power module 71, connected electrically with the power module 71 by solder 75, and also fixed to the heat sink 70 by screws 76. 77 designates a cover which is secured to the heat sink 70 by screws 78 to protect the printed circuit board 74 from dust, dirt, foreign matter, impact and/or the like and to prevent the electric shock of a person who operates the inverter apparatus. 79 indicates a top of the cover 77, 80 designates a casing which accommodates the power module 71, and 81 denotes installation fittings of the heat sink 70.

The operation of the conventional inverter apparatus designed as described above will now be described. The printed circuit board 74 is loaded with the power circuit, control circuit, display unit, operation units, wiring, main circuit device drive and protection circuits, and other components to control, for example, the operation of an alternating-current motor. The power module 71 contains the respective main circuit devices of a converter circuit which converts an alternating-current input into a direct current and an inverter circuit which converts the direct current into an alternating current.

The power module 71 is connected electrically with the printed circuit board 74 by the solder 75, operates under the control of the signal of the drive circuit given as a result of the operations of the circuits on the printed circuit board 74, and switches the main circuit devices on/off to drive the alternating-current motor as desired. The heat sink 70 is secured in close contact with the cooling surface 73 of the power module 71 by the screws 76 and acts to dissipate heat generated by the main circuit devices contained in the power module 71 and thereby reduce the temperature below a specified value.

The conventional inverter apparatus arranged as described above has a first disadvantage involving excess cost. Specifically, the casing 80 of the power module 71 was further covered and protected by the cover 77. Accordingly, there was an added cost for the casing 80 of the power module 71.

The conventional inverter apparatus had a second disadvantage that it required the heat sink 70 to be quite large and have a high cooling capability, thereby increasing the size of the inverter apparatus. The large heat sink is required to serve the so-called high-frequency PWM control systems that have been preferred recently and have a high switching frequency (10 to 20 kHz) in order to reduce the electromagnetic noise generated by the alternating-current motor. However, such systems generate a great deal of heat due to the considerable heat loss of the main circuit devices in the inverter circuit contained in the power module 71, as compared to those in the conventional inverter circuit having the switching frequency of only several kHz.

Because of the low prices of rapidly switchable main circuit devices (such as IGBT's) and the increased speed of the microprocessor in the control circuit, there is only one significant basis for a difference in cost and size between the conventional inverters having the switching frequency of several kHz and the recently used high-frequency PWM control inverters having the high switching frequency of 10 to 20 kHz, namely, the heat sink. Hence, although slightly larger in size as compared to the conventional inverters having a switching frequency of only several kHz, inverters using high-frequency PWM which produces an effect on reducing electromagnetic noise are finding general use. However, there still is a desire to make the high-frequency PWM inverter apparatuses more compact.

Further, the conventional inverter apparatus had a third disadvantage based on its containment in a control box. The dimension in the depth direction of the heat sink, i.e., the height direction of the inverter apparatus shown in FIG. 7, must be increased because there is a predetermined size of installation space. Accordingly, the depth dimension inside the control box had to be increased and the control box could not be reduced in size.

SUMMARY OF THE INVENTION

In an inverter apparatus concerned with a first embodiment of the invention, the apparatus comprises a power module which contains the respective main circuit semiconductor devices of a converter circuit for converting an alternating-current input into a direct current and an inverter circuit for converting the direct current into an alternating current. The heat sink and the casing for the power module are made to have the same cross sectional size. Specifically, each of the heat sink, the casing for the power module and the body for the inverter, has two pairs of parallel side faces that are dimensioned to constitute part of the side walls of the inverter apparatus. The heat sink, the casing and the body are fastened together by corresponding fastening means to form the inverter enclosure. When assembled, the projection area of the heat sink on a plane defined by the surface where the heat sink makes contact with the power module case and the projection area of the body on a plane defined by the surface where the power module casing and the inverter body make contact are designed to be substantially equal.

A further feature of the inverter apparatus concerned with the invention is that a printed circuit board is connected electrically with the power module and is loaded on said power module.

Yet another feature of the inverter apparatus concerned with the invention is that drive and protection circuits for the main circuit semiconductor devices are loaded on the printed circuit board.

A further feature is that a main circuit terminal block connected electrically with the main circuit semiconductor devices is loaded on the power module.

Another feature is that there are guide holes provided in the printed circuit board and guiding projections provided on the power module to pass through said guide holes.

There also is a notch formed in the side face of the power module and a ground terminal provided on the exposed surface of the heat sink revealed in said notch.

An additional feature of the inverter apparatus concerned with the invention comprises mounting screw inserting holes formed in the heat sink and notches formed in the side faces of the power module located on the axis prolongation of the mounting screw inserting holes.

In the inverter apparatus concerned with the invention, positioning holes or positioning projections are formed on the cooling surface side of the power module and positioning projections or positioning holes fitted with said positioning holes or said positioning projections are provided on the side of a surface where the heat sink makes contact with the power module.

In another feature of the inverter apparatus, a power module containing main circuit semiconductor devices, a case which accommodates a printed circuit board, a setting section and a display section, and a heat sink which cools the power module, the case is disposed on said power module and fastened to the power module by fastening means, the printed circuit board is guided to a predetermined position on the power module by guiding means and secured to the power module by first screw members, and the power module is disposed in a predetermined position on the heat sink by positioning means, and further the power module and heat sink are fastened integrally from above said case by second screw members.

The inverter apparatus concerned with the invention is designed to drive an alternating-current motor, the apparatus comprises an enclosure having a window formed in the side face thereof, and a spacer fitted removably to said window for covering the center of the window.

Finally, the invention comprises a method of using the inverter apparatus, wherein a power module containing at least the respective main circuit semiconductor devices of a converter circuit for converting an alternating-current input into a direct current and an inverter circuit for converting the direct current into an alternating current can be installed to and removed from a heat sink fitted to the cooling surface of said power module, allowing a heat sink higher in cooling capacity to be used when the switching frequency of the inverter circuit in the inverter apparatus is greater than or equal to a predetermined value, while heat sink lower in relative cooling capacity can be used when the switching frequency of the inverter circuit in the inverter apparatus is less than the predetermined value.

DESCRIPTION OF THE PREFERRED EMBODIMENTS

Figure 1:
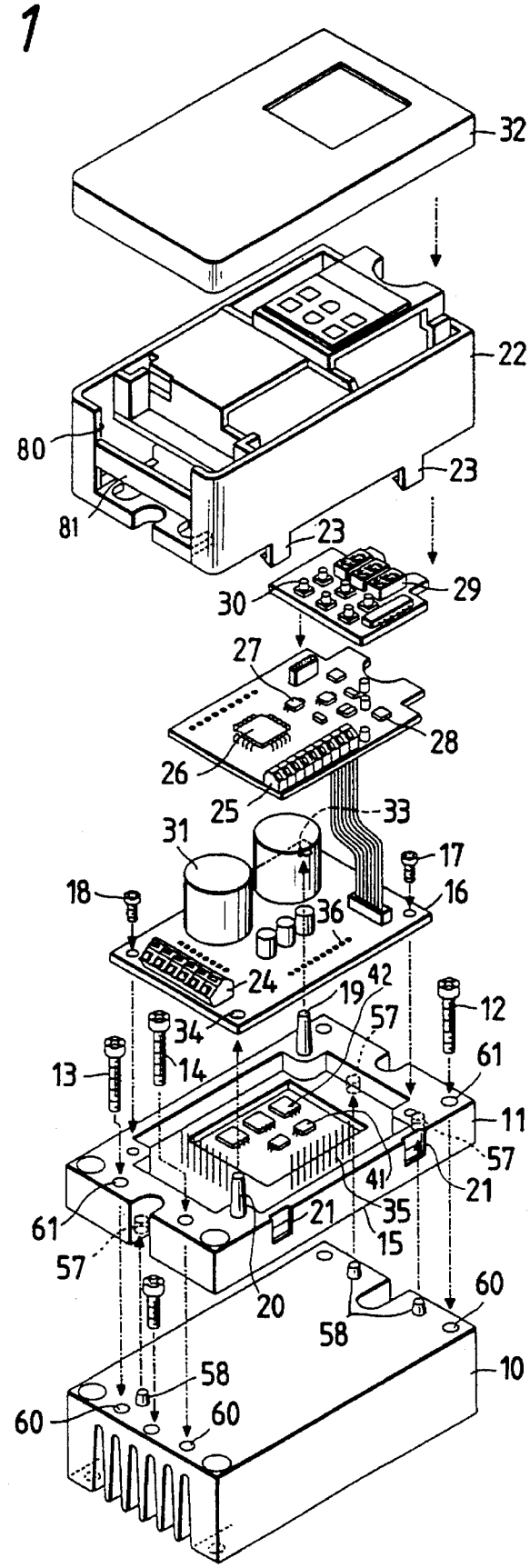
FIG. 1 is an exploded perspective view of an inverter apparatus according to a first to a sixth embodiments of the present invention.

A preferred embodiment of the present invention will now be described in accordance with FIG. 1. FIG. 1 is an exploded perspective view of an inverter apparatus illustrating the present invention. In the figure, the numeral 10 indicates a heat sink having two pairs of parallel side walls while 11 designates a power module case which also has two pairs of parallel side walls. The power module case 11 is secured in close contact with the heat sink 10 by screws 12 to 14 so that a cooling surface 15 of the module is in contact with the heat sink 10. The interface between the sink 10 and case 11 is substantially planar and the projection of the case and module onto the plane is substantially coextensive. 16 represents a printed circuit board which is connected electrically with the top of the power module 11 in FIG. 1 by solder or the like, and is also fixed mechanically thereto by screws 17, 18 in a manner which will provide measures against vibration. 19 and 20 denote tapered guide members which are formed on the power module 11 and function as guides when the printed circuit board 16 is connected with the power module 11. 21 indicates recesses provided in the side faces of the power module case 11 and 22 denotes a body molded by a resin material to protect the printed circuit board 16 from dust, dirt, foreign matter, impact, etc., and to prevent the electric shock of a person who operates the inverter apparatus. The body also has two pairs of parallel sides and at a planar interface between the body and the case 11, a projection of each onto the plane will be substantially coextensive. 23 represents catches which are provided on the body 22, have a spring action, and engage with the recesses 21 formed in the power module 11 to secure the power module 11 to the body 22 in a fitting design. The power module 11 is exposed between the heat sink 10 and the body 22, and the projection area of the heat sink 10 in the plane direction of a surface where the heat sink 10 makes contact with the power module 11 is substantially equal to the projection area of the power module 11 in the same direction and to that of the body 22 in the same direction. 24 indicates a main circuit terminal block, 25 designates a control circuit terminal block, 26 denotes main circuit drive and protection circuits, 27 represents a power circuit, 28 indicates a control circuit, 29 denotes display unit, 30 represents an operation unit, 31 indicates a main circuit electrolytic capacitor, and 32 designates a cover for the body 22. 33 and 34 denote guide holes for the guide members 19 and 20, respectively, formed in the printed circuit board 16, 35 represents pins which connect the power module 11 and the printed circuit board 16, 36 indicates insertion holes of the pins 35 formed in the printed circuit board 16, 57 denotes positioning holes formed in the power module 11, and 58 represents positioning projections formed on the heat sink 10.

Figure 2:
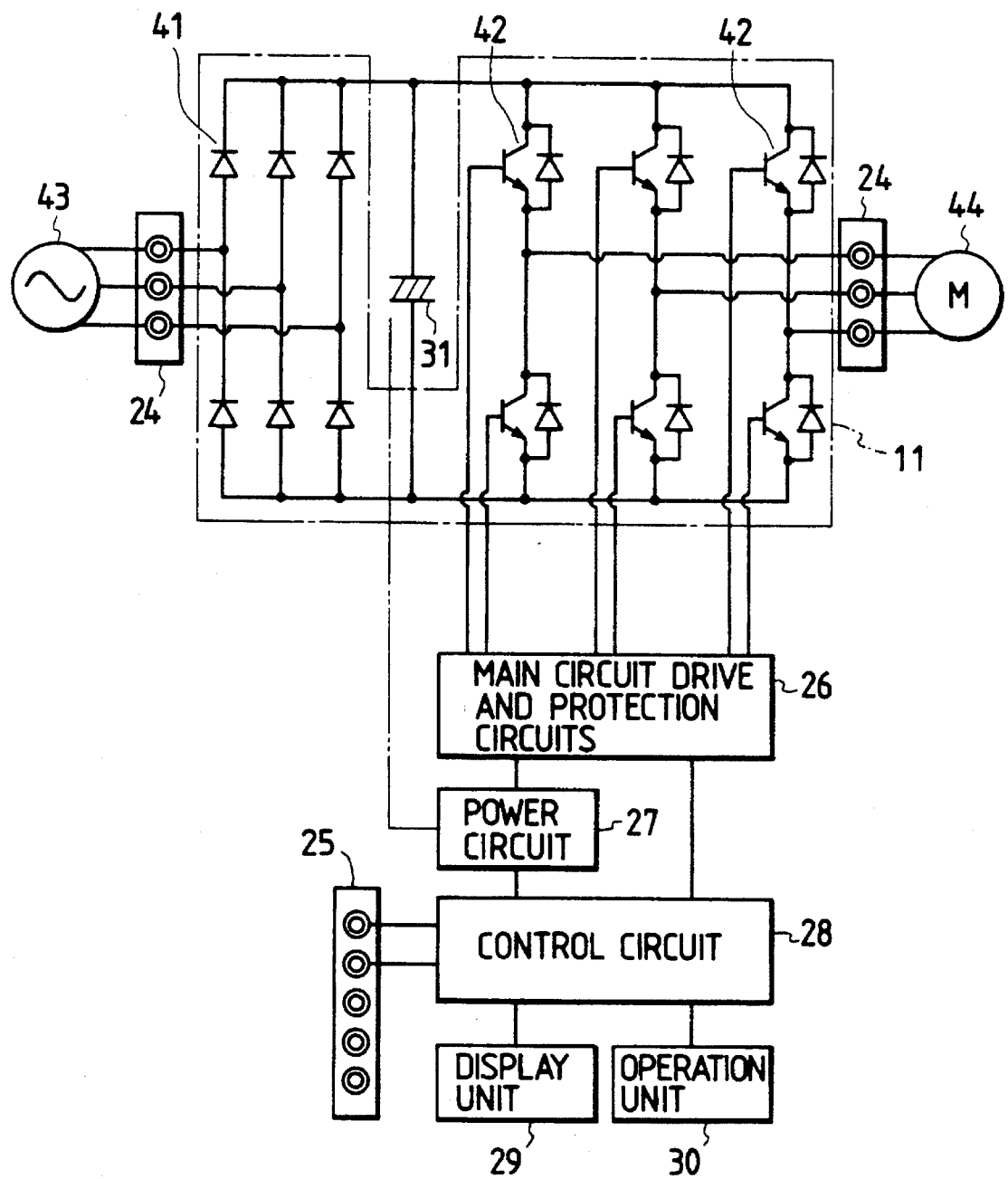
Fig. 2 is a general circuit diagram of the inverter according to the embodiments of the present invention.

The arrangement of the circuits will now be described with reference to FIGS. 1 and 2, wherein 41 indicates main circuit devices (such as diodes) of the converter circuit which converts the alternating current input into the direct current and 42 represents main circuit devices (such as bipolar transistors, IGBT's, MOSFET's, GTO's) of the inverter circuit which converts the direct current into the alternating current, all of which are contained in the power module 11. These main circuit devices 41, 42 are connected electrically with the input terminals and output terminals of the main circuit terminal block 24 on the printed circuit board 16, respectively, by pins, solder or the like, an alternating-current power supply 43 is coupled with the input terminals, and an alternating-current motor 44 is coupled with the output terminals. Further, the main circuit devices 42 of the inverter circuit are connected electrically with the main circuit drive and protection circuits 26 on the printed circuit board 16 by pins, solder or the like, and said main circuit drive and protection circuits 26 drive the main circuit devices 42 under the control of PWM signals from the control circuit 28 consisting of a microprocessor and other components on the printed circuit board 16.

The control circuit terminal block 25 mounted on the printed circuit board 16 includes a plurality of control terminals connected to the control circuit 28, and these control terminals are coupled as required with an alternating-current motor 44 forward-reverse rotation inverting switch, a stepless speed changing variable resistor and the like. The display unit 29 is mounted on the printed circuit board 16 and is connected to the control circuit 37 to display the speed, etc., of the alternating-current motor 44. The operation unit 30 is mounted on the printed circuit board 16 and is also connected to the control circuit 28 to permit operations such as the start, stop, and speed change of the alternating-current motor 44. The main circuit electrolytic capacitor 31 on the printed circuit board 16 is connected between the converter circuit and the inverter circuit in the main circuit, and the power circuit 27 drops the direct-current voltage across the main circuit electrolytic capacitor 31 and supplies the resultant voltage to the main circuit drive and protection circuits 26, the control circuit 28, etc.

The operation of the preferred embodiment of the present invention will now be described. The printed circuit board 16 has mounted thereon the power circuit 27, the control circuit 28, the display unit 29, the operation unit 30, the terminal blocks 24, 25, the main circuit device drive and protection circuits 26, the main circuit electrolytic capacitor 31 and other components of the inverter apparatus to control the alternating-current motor 44 so that it operates as desired. On the other hand, the power module 11 accommodates the main circuit devices 41, 42 of the converter circuit which converts the alternating-current input into the direct current and the inverter circuit which converts the direct current into the alternating current. The power module 11 is connected electrically with the printed circuit board 16 by solder or the like, operates under the control of signals from the drive circuit that are generated as a result of the operations of the circuits on the printed circuit board 16, and switches the main circuit devices on/off to drive the alternating-current motor 44 as desired. The heat sink 10 is fixed in close contact with the cooling surface of the power module 11 by the screws 12 to 14 in order to dissipate heat generated by the main circuit devices contained in the power module 11 and to reduce the temperature of the power module 11 below a specified value. 23 indicates catches which fit in the recesses 21 of the power module 11 and are pushed open by a spring action to fix the body 22 to the power module 11

When the inverter apparatus has switching frequency changing circuit therein, it is preferable that the heat sink 10 can be changed since the heat loss of the main circuit devices 42 in the inverter circuit depends on the switching frequency. Namely, when the switching frequency is low, the heat sink 10 may be small because of the little heat loss of the main circuit devices 42, but when the switching frequency is high, a large heat sink 10 is required because of the increased heat loss. Ordinarily, a manufacturer sets the switching frequency to a low value in the standard shipping state and supplies a compact, low-priced inverter apparatus to a user. However, when it is desirable to reduce the magnetic noise of the alternating-current motor, the user increases the setting of the switching frequency. In order to compensate for the increased heat generated under these conditions, the operator also takes the body 22 off, removes the screws 12 to 14, dismounts the heat sink 10, installs a new, larger heat sink 10 higher in cooling capability, fixes the power module 11 and the heat sink 10 with the screws 12 to 14 again, and fits the body 22. This allows the user to easily adapt the inverter apparatus to required operating conditions.

In FIG. 1, the main circuit printed circuit board 16 is provided on the power module 11 to wire the power module 11 and the main circuit printed circuit board 16 in the shortest distance. The main circuit devices 41, 42 must be driven and protected with extreme care because of the high switching speed. Namely, the rapid switching operation results in a high current change ratio, which leads to a noise voltage due to wiring inductance, causing the malfunction of the circuit. Therefore, it is desired that the drive and protection circuits 26 for the main circuit devices 41, 42 are disposed adjacent the main circuit devices 41, 42.

Accordingly, it is primarily desired to load the drive and protection circuits 26 inside the power module 11. However, since heat generated by the power module 11 will stress the main circuit devices 41, 42, the main circuit printed circuit board 16 is provided on the power module 11 to wire the power module 11 and the main circuit printed circuit board 16 in the shortest distance to avoid the problems related to noise and heat generation. Epoxy or the like, which was employed conventionally to harden the chip surfaces of the power module 11 for the protection of the chips, is not required when the chip surfaces are covered by the main circuit printed circuit board 16 as described above. This provides many advantages in costs and reliability. In particular, since thermal change causes stress to the casing, epoxy, chips, wiring, etc., due to their different expansion coefficients, the ability of the present invention to avoid use of epoxy will assure reliable wiring connections even where there are severe temperature cycles.

In FIG. 1, the body 22 may be molded by a resin material and 80 denotes a window formed in the side face of the body 22, and 81 designates a spacer installed removably in the window 80 to cover the middle of the window 80, whereby the window 80 is divided into a top window section and a bottom window section. On the basis of this design, the wiring from the terminal block 25 can be drawn through the top window section, and the wiring from the terminal block 24 can be drawn through the bottom window section.

The wiring work of the apparatus according to the present embodiment designed as described above will now be described. First, when the main circuit is wired, the spacer 81 is removed and the wiring work is done. Subsequently, when the control circuit is wired, the spacer 81 is installed and the wiring work is carried out. In this way, the main circuit wiring and the control circuit 15 wiring can be separated without interference with the other's wiring.

In this embodiment, the guide holes 33, 34 are provided in the two diagonal corners of the printed circuit board 16 and the two guiding projections 19, 20 to be inserted into the guide holes 33, 34 are provided on the power module 11. The guiding projections 19, 20 are preferably tapered. The plurality of pins 35 for connecting the main circuit devices 41, 42 to the printed circuit board 16 stand on the power module 11, the insertion holes 36 for the pins 35 are formed in the printed circuit board 16, and the top ends of the guiding projections 19, 20 are higher than those of the pins 35. The number of guiding hole 33, 34 and guide projection 19, 20 combinations may be two or more and their numbers and positions may be changed as appropriate.

According to the present embodiment, when the printed circuit board 16 is lowered and loaded onto the power module 11, the guiding projections 19, 20 are first inserted into the guide holes 33, 34, whereby the printed circuit board 16 is guided to a normal loading position precisely, and when the pins 35 are subsequently inserted into the insertion holes 36, their positions match without any positioning and the pins 35 are inserted into the holes 36 smoothly. Accordingly, manual positioning work for loading the printed circuit board 16 can be done easily by a worker and the loading of the printed circuit board 16 can be automated by a robot or the like.

In FIG. 1, positioning holes 57 are formed in three places of the bottom surface of the power module 11 and three positioning projections 58 which fit said positioning holes 57 are formed on the top surface of the heat sink 10. The number of positioning hole 57 and positioning projection 58 combinations may be two or more and their numbers and positions may be changed as appropriate. It should be noted that the positioning holes 57 and the positioning projections 58 are preferably disposed to disable the heat sink 10 and the power module 11 from matching with each other in a direction 180 degrees apart.

According to this embodiment, merely fitting the corresponding positioning holes 57 and positioning projections 58 allows the heat sink 16 and the power module 11 to be matched correctly and prevents the future offset of the heat sink 10 and the power module 11. Hence, when the power module 11 is subsequently fastened to the heat sink 10 by the screws 12 to 14, there is no likelihood that internally threaded holes 60 in the heat sink 10 are offset from mounting holes 61 in the power module 11 to ensure ease of fastening. Also, the present embodiment may be utilized in a power module 11 inspection line wherein the positioning holes 57 are fitted with positioning projections provided on a temporary holding plate (not shown) to place a plurality of power modules 11 on the temporary holding plate for inspection. In this case, since the power modules 11 are always placed in predetermined positions, an inspection probe can be operated by a robot or the like.

Figure 3:
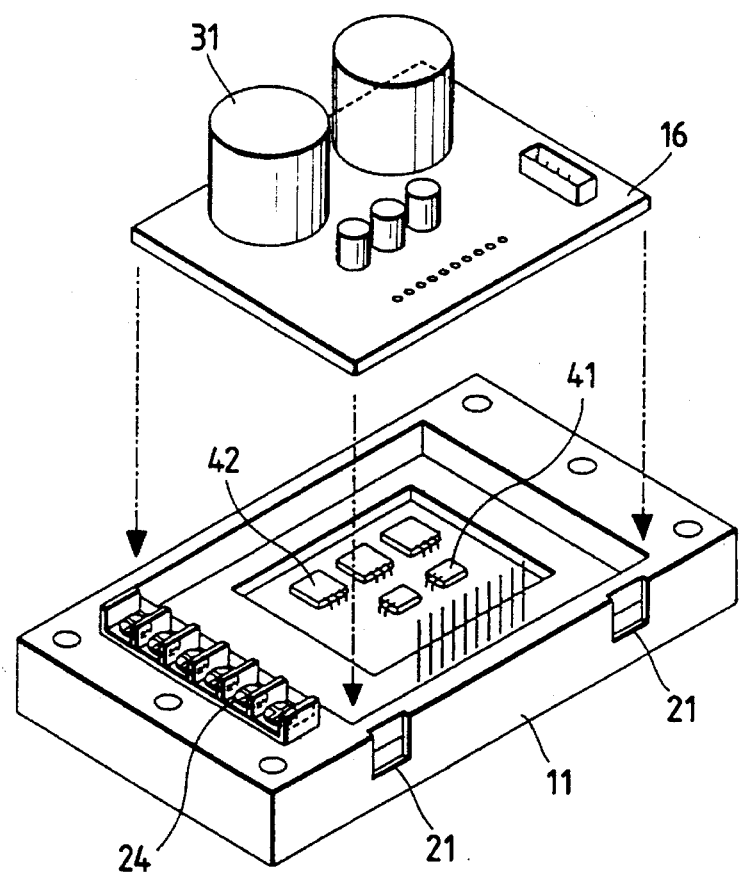
Fig. 3 is a general circuit diagram of an inverter apparatus according to a seventh embodiment of the present invention.

A further feature of the invention will be described in accordance with FIG. 3. In this embodiment, the main circuit terminal block 24 is directly loaded on the power module case 11 and the main circuit devices 41, 42 are connected electrically with the main circuit terminal block 24, while, in the first embodiment, the main circuit terminal block 24 was loaded on the printed circuit board 16 and was connected to the main circuit devices 41, 42 via the printed circuit board 16. However, since the main circuit terminal block 24 is connected only to the main circuit devices 41, 42, their connection did not have to be made via the printed circuit board 16. In the present embodiment, therefore, the main circuit terminal block 24 was loaded on the power module 11 as described above.

According to this embodiment, the number of connection points in the wiring between the main circuit terminal block 24 and the main circuit devices 41, 42 is reduced, whereby the number of processes decreases to enhance efficiency. Also, the printed circuit board 16 can be made compact since the loading part of the main circuit terminal block 24 is not required, whereby the loss of costs is eliminated and the price can be reduced.

Figure 4:
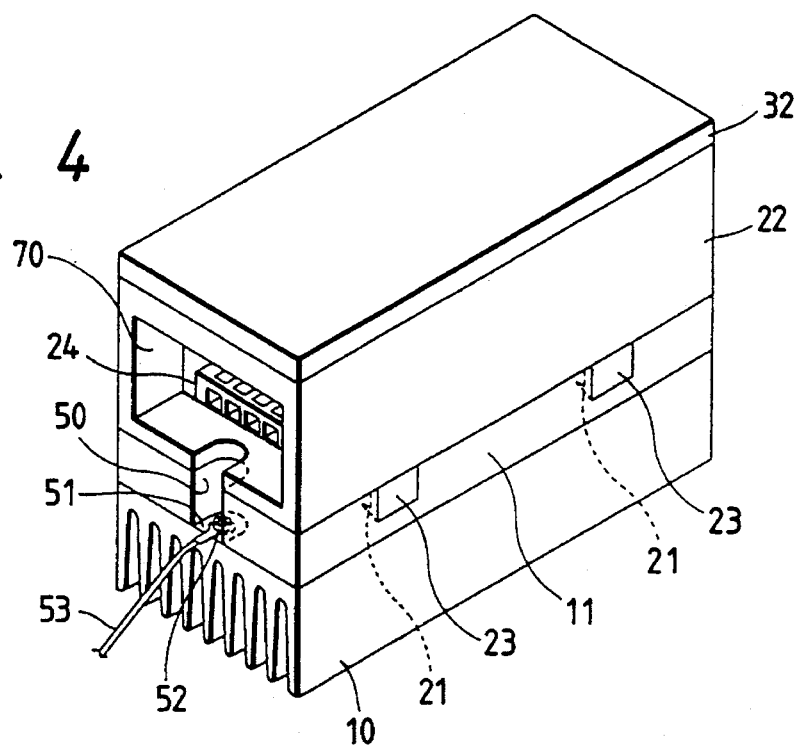
Fig. 4 is an arrangement diagram of an inverter apparatus according to an eighth embodiment of the present invention.

FIG. 4 shows another embodiment of the present invention. In the present embodiment, a notch 50 U-shaped in the plane direction is formed in part of the side face of the power module 11 adjacent the main circuit terminal block 24. A screw type ground terminal 52 is provided on an exposed surface 51 of the heat sink 10 revealed in the notch 50 and is connected with a ground cable 53. It is to be understood that the position of the notch 50 formed in the side face of the power module 11 can be changed as appropriate.

Because of the standards of this type of inverter apparatus, the ground terminal 52 must be provided on the heat sink 10. In the conventional inverter apparatus, therefore, the ground terminal 52 was provided in a hole bored as appropriate in the side face of the heat sink 10. However, for example, when another object existed immediately beside the heat sink 10, it was difficult to connect the ground cable. According to the present embodiment, the ground terminal 52 provided on the exposed surface 51 of the heat sink 10, i.e., part of the top surface of the heat sink 10, always ensures ease of connecting the ground cable 53 even if another object exists in the periphery of the heat sink 10. Further, in the present embodiment, the ground terminal 52 disposed adjacent the main circuit terminal block 24 makes it easy to combine the wiring from the alternating-current power supply or the alternating-current motor to the inverter apparatus and the ground cable 53 into one.

Figure 5:
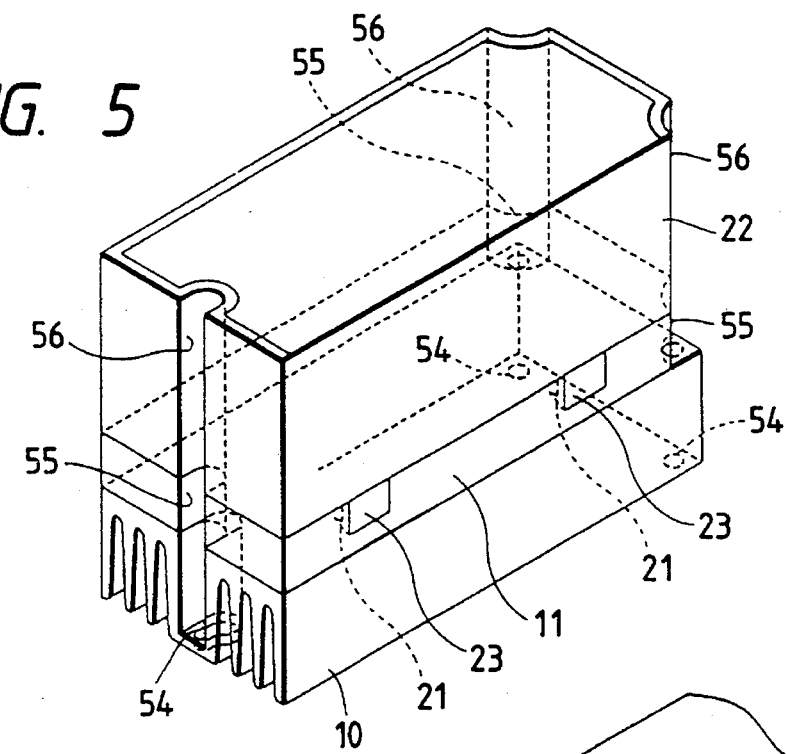
FIG. 5 is an arrangement diagram of an inverter apparatus according to a ninth embodiment of the present invention.

FIG. 5 shows a further embodiment of the present invention. In this embodiment, mounting screw inserting holes 54 where screws for installing the inverter apparatus to a mounting member are inserted are formed in three places of the bottom end periphery of the heat sink 10. Also, notches 55, 56 U-shaped or fan-shaped in the plane direction and located on the axis prolongation of said mounting screw inserting holes 54 are formed in the side faces of the power module 11 and the body 22. It is to be understood that the positions of the notches 55, 56 formed in the side faces of the power module 11 and the body 22 may be changed as appropriate.

According to the present embodiment, a screwdriver used to tighten screws inserted in the mounting screw inserting holes 54 can also be passed into the notches 55, 56 of the power module 11 and the body 22, whereby the screws can be tightened easily without the screwdriver being inclined. It will be recognized that the body 22 may be removed at the time of said tightening, and in such a case, there may not be the notches 56 of the body 22.

Figure 6:
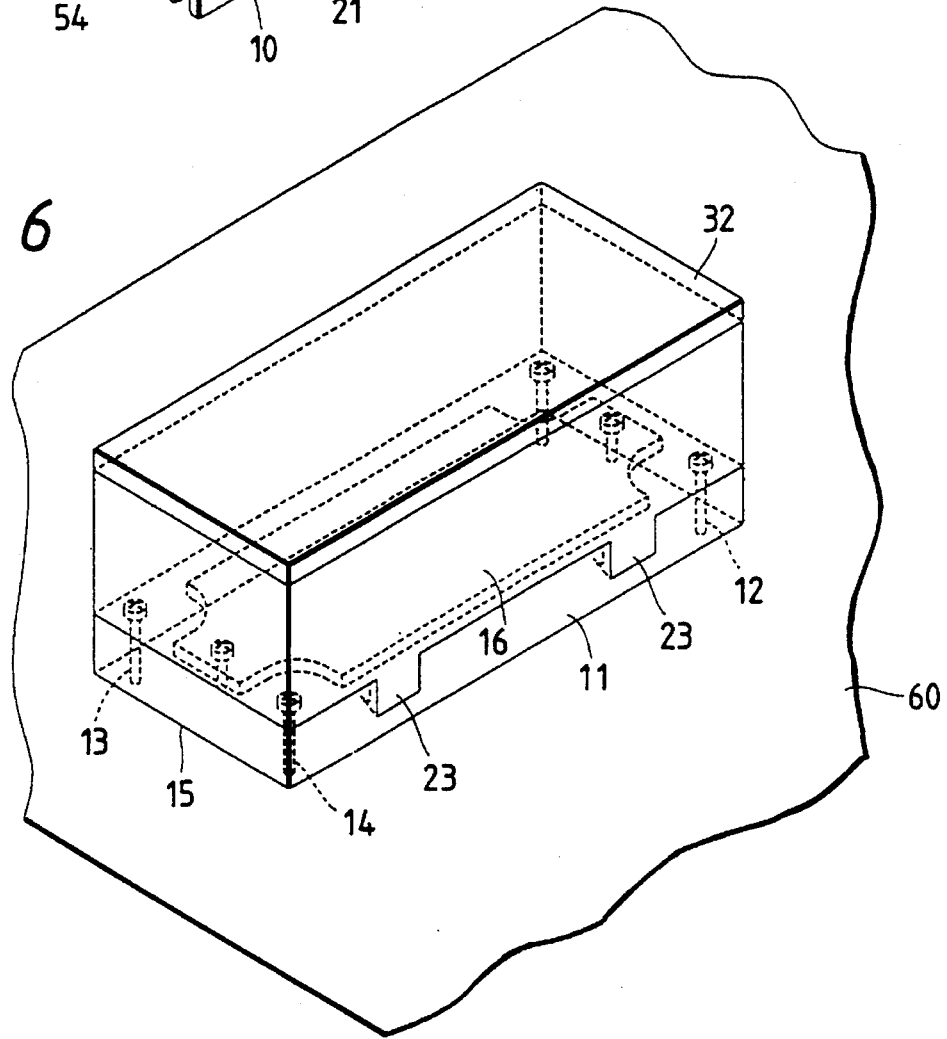
FIG. 6 is an arrangement diagram of an inverter apparatus according to a tenth embodiment of the present invention.
Figure 7:
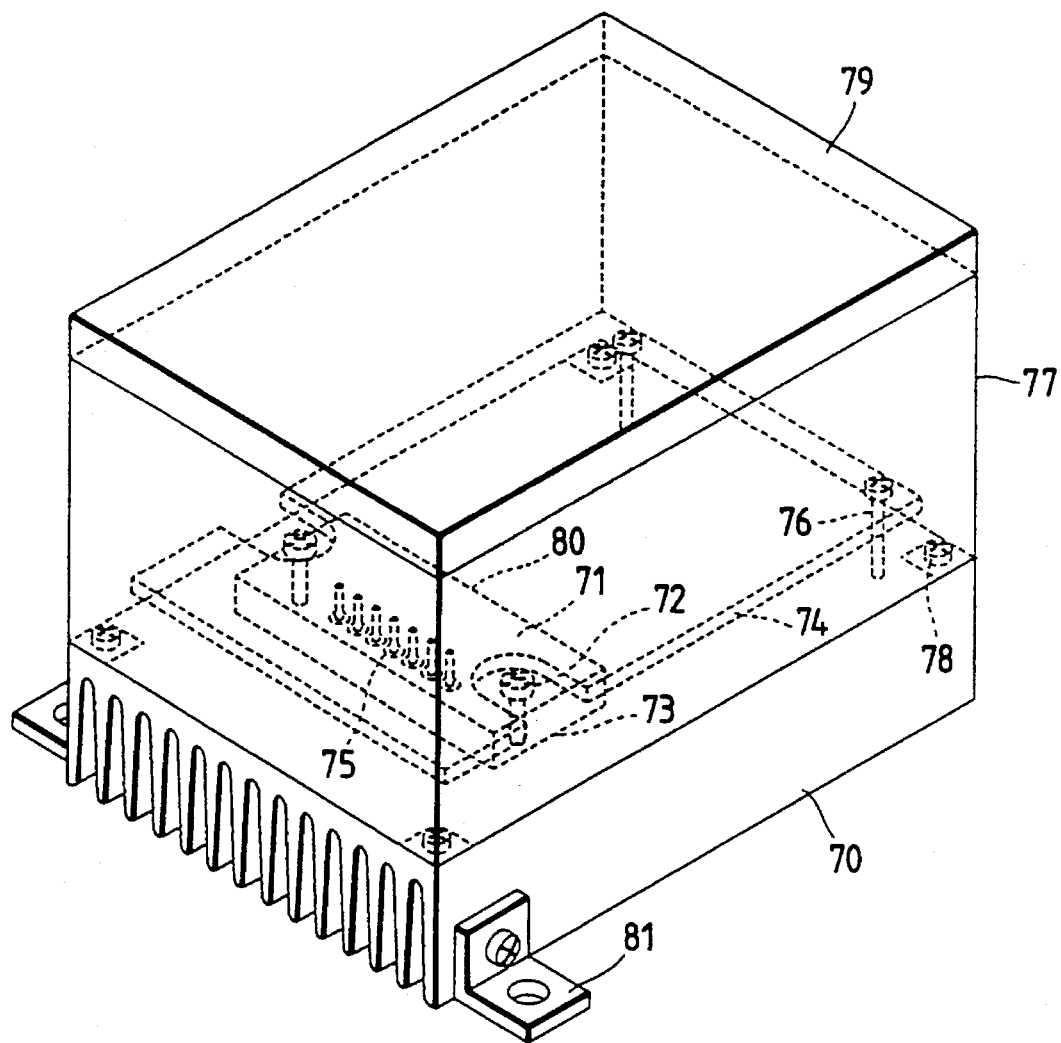
Fig. 7 is an arrangement diagram of a conventional inverter apparatus known in the art.

FIG. 6 shows an embodiment wherein the inverter apparatus is installed on a wall surface 60 which has cooling capability (for example, the wall surface of a control box made of metal). In this case, the body 22 is dismounted, the screws 12 to 14 are removed, and the heat sink 10 is removed, whereby the cooling surface 15 of the power module 11 is fixed directly to the wall surface 60. This causes heat generated by the power module 11 to be dissipated into the air and the temperature of the power module 11 to drop below a specified value. When a plurality of inverter apparatuses are installed to the wall surface 60 of the control box as described above, the present embodiment keeps heat generated from filling the control box, whereby the control box can be reduced in size, and the present embodiment allows the inverter apparatuses to be contained in the control box easily, whereby the inverter apparatus can be used in a hostile environment.

Whereas the inverter apparatus wherein the power module 11 was loaded with the semiconductor devices of the main circuit was described in each of the foregoing embodiments, the power module 11 may be incorporated with semiconductor device drive and protection circuits as in an intelligent power module (IPM), which recently appeared on the market, whereby the size can be reduced, resulting in a convenience. Further, the power module 11 may be incorporated with the power circuit, control circuit, display circuit, operation means, wiring means, etc., to produce the identical effects.

It will be apparent that the present invention, as described above, achieves an inverter apparatus wherein the projection area of a heat sink, the projection area of a power module, and the projection area of a body serving as part of an enclosure are substantially equal, whereby the inverter apparatus itself will be streamlined.

It will also be apparent that the present invention achieves an inverter apparatus wherein the power module is loaded with a printed circuit board to contribute to the size reduction of the inverter apparatus. Also, the power module and the printed circuit board can be wired in the shortest distance and the main circuit devices, etc., of the power module need not be hardened by epoxy or the like to provide advantages in costs and reliability.

It will also be apparent that the present invention achieves an inverter apparatus wherein the printed circuit board is loaded with at least the drive circuit and protection circuit for the main circuit semiconductor devices, whereby said circuits and the main circuit devices of the power module can be wired in the shortest distance to reduce noise due to decreased wiring inductance.

It will also be apparent that the present invention achieves an inverter apparatus wherein the power module is loaded with a main circuit terminal block, whereby the number of connection points in the wiring between the main circuit terminal block and the main circuit devices is reduced and the number of processes is decreased to enhance efficiency. Also, the printed circuit board can be reduced in size since the loading part of the main circuit terminal block is not required, whereby the loss of costs is eliminated and the inverter apparatus can be lowered in price.

It will also be apparent that the present invention achieves an inverter apparatus wherein guide holes are provided in the printed circuit board and guiding projections are provided on the power module, whereby when the printed circuit board is loaded on the power module, the printed circuit board is guided to a normal loading position accurately to facilitate manual position matching work and to enable the automation of loading by means of a robot or the like.

It will also be apparent that the present invention achieves an inverter apparatus wherein a notch is formed in the side face of the power module and a ground terminal is provided on the exposed surface of the heat sink revealed in said notch to ensure ease of connecting a ground cable.

It will also be apparent that the present invention achieves an inverter apparatus wherein mounting screw inserting holes are formed in the heat sink and notches are formed in the side faces of the power module, whereby when screws are tightened into the mounting screw inserting holes by a screwdriver, the screws can be tightened easily without the screwdriver being inclined.

It will also be apparent that the present invention achieves an inverter apparatus wherein positioning holes or positioning projections are formed on the cooling surface side of the power module and positioning projections or positioning holes fitting said positioning holes or positioning projections are formed on the side of a surface where the heat sink makes contact with the power module, whereby the fitting of said positioning holes and said positioning projections allows the heat sink and the power module to be matched correctly and the future offset of the heat sink and the power module to be prevented.

It will also be apparent that the present invention achieves an inverter apparatus wherein a case, a power module and a heat sink are installed in a predetermined position relationship with each other and the power module and the heat sink can be fastened by screw members without the case being removed.

It will also be apparent that the present invention achieves an inverter apparatus wherein a window formed in the side face of the enclosure and a spacer is fitted removably to cover the center of said window, whereby main circuit wiring and control circuit wiring can be separated without interference with wiring work.

It will also be apparent that the present invention achieves an inverter apparatus, having a power module containing at least the respective main circuit semiconductor devices of a converter circuit which converts an alternating-current input into a direct current and an inverter circuit which converts the direct current into an alternating current and a heat sink, wherein a plurality of heat sinks of different capacity can be installed to and removed from the power module.

Further, when the inverter apparatus is contained in a control box, the heat sink can be removed and the inverter apparatus can be installed to a heat-absorbing wall surface of the control box instead of the heat sink, whereby the depth dimension of the control box can be decreased as compared to the dimension at a time when the conventional inverter apparatus is contained to make a large contribution toward reducing the size of the control box.

It will be apparent that not only when the inverter apparatus is contained in the control box but also when it is installed directly to, for example, a metal wall surface, the removal of the heat sink offers a considerable size reduction.

What is claimed is:

1. An inverter apparatus having an enclosure and being operative to drive an alternating-current motor, comprising:

a converter circuit for converting an alternating-current input into a direct current and an inverter circuit for converting the direct current into the alternating current;

a power module case supporting a power module including heat generating components comprising said converter circuit and said inverter circuit, said case having pairs of parallel side faces which are sized to constitute part of the enclosure of said inverter apparatus;

a body disposed on said power module case and meeting at a first substantially planar interface, said body having pairs of parallel side faces which are sized to be part of the enclosure of said inverter apparatus and being removably fastened to said power module case by fastening means; and a heat sink for cooling said heat generating components, said heat sink making contact with said power module case at a second substantially planar interface; and wherein the surface area of said heat sink at said second substantially planar interface and the surface area of said power module case at said second substantially planar interface are substantially equal.

2. The inverter apparatus as defined in claim 1, wherein the surface area of said body at said first substantially planar interface and the surface area of said power module case at said first substantially planar interface are substantially equal.

3. The inverter apparatus as defined in claim 1, wherein a printed circuit board connected electrically with the power module and at least drive and protection circuits for main circuit semiconductor devices are mounted on said printed circuit board.

4. The inverter apparatus as defined in claim 1, further comprising a printed circuit board, having a main circuit terminal block and main circuit semiconductor devices, is mounted on said power module case.

5. The inverter apparatus as defined in claim 4, further comprising guiding holes provided in said printed circuit board and guiding projections on said power module case, said projections being disposed to pass through said guiding holes when said inverter apparatus is assembled.

6. The inverter apparatus as defined in claim 1, further comprising a notch formed in the side face of the power module and a ground terminal provided on a surface of the heat sink and being accessible from said notch.

7. The inverter apparatus as defined in claim 1, further comprising mounting screw inserting holes having an axial direction and formed in said heat sink and notches formed in at least one pair of said side faces of said power module case, said notches being located on an extension of said axial direction of said mounting screw inserting holes.

8. The inverter apparatus as defined in claim 1, wherein at least one of first positioning holes or first positioning projections are formed on the cooling surface side of said power module and at least one of corresponding second positioning projections or second positioning holes, fitted to said first positioning holes or said first positioning projections are provided on the side of a heat-receiving surface where said heat sink interfaces with said power module case.

9. An inverter apparatus for driving an alternating-current motor, as set forth in claim 1 wherein:
said body has a window formed in the side face thereof; and
a spacer is fitted removably to said window for covering the center of said window.

10. An inverter apparatus for driving an alternating-current motor, as set forth in claim 1 wherein:
said heat sink is sized with respect to the operating frequency of said inverter circuit and is removably attached for replacement when said operating frequency is changed.

11. An inverter apparatus as defined in claim 1, further comprising a cover for attachment to said body opposite to said power module case.

12. An inverter apparatus for driving an alternating-current motor, as set forth in claim 1, wherein:
said inverter circuit has an adjustable switching frequency,
said converter circuit and said inverter circuit include a common capacitor having a capacity matched to said adjustable switching frequency, and
said heat sink is sized with respect to the adjustable switching frequency of said inverter circuit and is removably attached for replacement when said adjustable switching frequency is changed.

13. An inverter apparatus comprising a power module case supporting a power module containing main circuit semiconductor devices, a body accommodating a printed circuit board, a setting section and a display section, and a heat sink for cooling said power module, wherein said body is disposed on said power module case and fastened to said power module case by fastening means, said printed circuit board being guided to a predetermined position on said power module case by guiding means and secured to said power module case by first screw members, and said power module case being disposed in a predetermined position on said heat sink by positioning means, and wherein said power module case and heat sink are fastened integrally from above said body by second screw members.

14. Method for using an inverter apparatus comprising a power module case, containing at least a portion of a converter circuit and an inverter circuit with a adjustable switching frequency, and a heat sink fitted to the cooling surface of said power module case and having a cooling capacity matched to an operating frequency, comprising:
adjusting the switching frequency of said inverter circuits, and
changing said heat sink such that a first heat sink higher in cooling capacity is used when the switching frequency of said inverter circuit is not less than a predetermined value, and a second heat sink lower in cooling capacity is used when the switching frequency of the inverter circuit in said inverter apparatus is less than said predetermined value.

\* \* \* \* \*